United States Patent
Pop et al.

(10) Patent No.: US 9,721,680 B2
(45) Date of Patent: Aug. 1, 2017

(54) OPERATING A NUCLEAR REACTOR USING A DEPOSIT MODEL OF A NUCLEAR REACTOR HEAT TRANSFER SURFACE

(71) Applicant: AREVA NP Inc., Lynchburg, VA (US)

(72) Inventors: Mihai G. M. Pop, Alexandria, VA (US); Joseph R. Wyatt, Lynchburg, VA (US); John C. Griffith, Lynchburg, VA (US)

(73) Assignee: AREVA Inc., Lynchburg, VA (US)

( * ) Notice: Subject to any disclaimer, the term of this patent is extended or adjusted under 35 U.S.C. 154(b) by 887 days.

(21) Appl. No.: 14/041,806

(22) Filed: Sep. 30, 2013

(65) Prior Publication Data
US 2015/0092901 A1  Apr. 2, 2015

(51) Int. Cl.
| | |
|---|---|
| G21D 3/10 | (2006.01) |
| G21C 7/00 | (2006.01) |
| G06F 17/50 | (2006.01) |
| G21C 17/00 | (2006.01) |
| G21D 3/00 | (2006.01) |

(52) U.S. Cl.
CPC ........... *G21C 7/00* (2013.01); *G06F 17/5009* (2013.01); *G21C 17/00* (2013.01); *G21D 3/10* (2013.01); *G21D 2003/005* (2013.01); *Y02E 30/40* (2013.01)

(58) Field of Classification Search
USPC ........................................................ 376/217
See application file for complete search history.

(56) References Cited

U.S. PATENT DOCUMENTS

| | | |
|---|---|---|
| 6,369,566 B1 | 4/2002 | McClelland |
| 6,891,912 B1 | 5/2005 | Lukic et al. |
| 7,420,165 B1 | 9/2008 | Pop et al. |
| 7,822,259 B2 | 10/2010 | Pop et al. |
| 2004/0151274 A1* | 8/2004 | Kropaczek ............ G21D 3/001 376/215 |

(Continued)

FOREIGN PATENT DOCUMENTS

WO   WO-2008/060327 A2   5/2008

OTHER PUBLICATIONS

Deshon et al., "Pressurized Water Reactor Fuel Crud and Corrosion Modeling." Aug. 2011 Journal of Minerals, Metals & Materials Society.*

(Continued)

*Primary Examiner* — Sean P Burke
(74) *Attorney, Agent, or Firm* — Davidson, Davidson & Kappel, LLC

(57) ABSTRACT

A method of operating a nuclear reactor is provided. The method includes defining a layer increment of a deposit layer modeling a deposit on a heat transfer surface of the nuclear reactor; periodically updating a thickness of the deposit layer by adding the layer increment to the deposit layer; recalculating properties of the deposit layer after each layer increment is added to the deposit layer; determining a temperature related variable of the heat transfer surface as a function of the recalculated properties of the deposit layer; and altering operation of the nuclear reactor when the temperature related variable of the heat transfer surface reaches a predetermined value. A method of modeling a deposit on a heat transfer surface of a nuclear reactor is also provided.

19 Claims, 13 Drawing Sheets

(56) References Cited

U.S. PATENT DOCUMENTS

2006/0227922 A1 10/2006 Pop et al.
2009/0292574 A1 11/2009 Pop

OTHER PUBLICATIONS

International Search Report for Corresponding PCT/US2014/058097.

Henshaw, "A model of chemistry and thermal hydraulics in PWR fuel crud deposits," Journal of Nuclear Materials, Jul. 1, 2006, vol. 353 No. 1-2.

Mike Pop et al., *Use of the Areva BWR Crud Model to Study High Zinc Operation At a US Plant*, 15th International Conference on Environmental Degradation of Materials in Nuclear Power Systems-Water Reactors (2011).

Paul Cohen, *Heat and Mass Transfer for Boiling in Porous Deposits with Chimneys*, AlChe Symposium, vol. 70, Issue 138, (1974), p. 71 to 80.

Tom Keheley et al., *Areva NP Approach to Fuel Reliability Using a Combination CFD Fuel Deposition Modeling*, Fontevraud 7 program (2010).

S. Le Caer et al., *Hydrogen Peroxide Formation in the Radiolysis of Hydrated Nanoporous Glasses: A Low and High Dose Study*, Chem. Phys. Lett. 450, (2007), 91-95.

Pascal Blondel et al., *Modelling of solute concentration into crud deposits under subcooled boiling conditions*, Excerpt from the Proceeding of the COMSOL Multiphysics User's Conference 2005 Paris (2005).

*CASL's Foray on CRUD*, CASL Tech Notes, vol. 1, Issue 1 (Jan. 2013).

Jones et al., *Modeling and Thermal Performance Evaluation of Porous Curd Layers in Sub-Cooled Boiling Region of PWRs and Effects of Sub-Cooled Nucleate Boiling on Anomalous Porous Crud Deposition on Fuel Pin Surfaces*, Department Nuclear, Plasma, and Radiological Engineering University of Illinois at Urbana-Champaign (Jun. 2005).

Ashley Guzzetta, *Modeling the Effects of Fuel Rod Crud Formation on Boiling Heat Transfer in a Pressurized Water Reactor Using Eulerian Two-Fluid CFD*, A Thesis in Nuclear Engineering (2010).

Michael P. Short, *Effects of Fluid Flow on 2D & 3D Coupled Microscale Simulations of Porous Boiling Deposits (CRUD) in PWRs*, The 9th International Topical Meeting on Nuclear Thermal-Hydraulics, Operation and Safety (NUTHOS-9) N9P0385, Kaohsiung, Taiwan, Sep. 9-13, 2012 (2012).

Pop et al., *PWR Fuel Deposit Analysis at a B&W Plant with a 24 Month Fuel Cycle*, 15th International Conference on Environmental Degradation of Materials in Nuclear Power Systems—Water Reactors, Aug. 7-11, 2011 (2011).

\* cited by examiner

PRIOR ART

OPERATING A NUCLEAR REACTOR USING A DEPOSIT MODEL OF A NUCLEAR REACTOR HEAT TRANSFER SURFACE

The present invention relates generally to a light water nuclear reactor and more specifically to a method of operating a nuclear reactor based on the modeling of deposits on heat transfer surfaces.

BACKGROUND

Power generators, including nuclear reactors, are used for power generation, research and propulsion. A power generation circuit generally includes a heat source such as a nuclear core or furnace and a coolant circuit. For light water reactor, respective coolant piping circuits transport the heated water or steam to either a steam generator and then a turbine, or directly to a turbine, and after going through a condenser (heat sink), carries circulating or feedwater back to the heating source. Operating temperatures and pressure may range up to or above the critical point of water. Depending on the operational conditions, the various materials used must withstand various load, environmental and radiation conditions.

Material used as coolant piping and other circuit and heat source components include but are not limited to carbon steels, stainless steels, nickel-based and other alloy steels and zirconium based alloys. These materials have to withstand the high temperature and high pressure conditions. Although the materials have been carefully selected, corrosion occurs caused by the corrosive nature of the environment: high temperature, high pressure water, steam, water radiolysis, additives in water and radiation effects. Such corrosion processes limit the lifetime of the systems in contact with the coolant fluid, and include but are not limited to stress corrosion cracking, flow accelerated corrosion, crevice corrosion, erosion corrosion, generalized corrosion and nodular corrosion.

Stress corrosion cracking (SCC), including intergranular stress corrosion cracking (IGSCC), is a well-known phenomenon happening to structural components in coolant circuits of a nuclear reactor, which affects the base and welding materials. SCC occurs through crack initiation and propagation, which are caused by a combination of chemical, tensile and ductile stresses (static and dynamic). Such stresses are common in nuclear environments caused by thermal expansion and contraction, residual stresses from welding, cold working, etc. The susceptibility toward SCC is often increased by the operating coolant environment, welding, heat treatment, radiolysis and radiation.

High oxygen content in the coolant fluid has been shown to accelerate SCC through higher rates of crack initiation and propagation. High oxygen content in the coolant fluid can stem from oxygen intrusion and water radiolysis processes, which create highly oxidizing species such as oxygen radical, hydrogen peroxide and many other radical species in the gamma, neutron, beta, and alpha flux.

Corrosion products present in the coolant fluid ultimately accumulate on the heat transfer surface, for instance on surfaces formed of zirconium of the fuel elements of a nuclear reactor core or on internal surfaces of steam generator tubes made of stainless steel, forming a deposit layer commonly called crud. The structure of the deposit layer varies within its thickness and comprises an outer portion of low density loose crud, harboring mostly water, which is in constant exchange with the circulating reactor water, but providing a metal oxide structure capable of attracting and retaining colloidal particulates. This portion of low density loose crud is called fluffy crud. Below the portion of fluffy crud, closer to the heat transfer surface, the deposit layer comprises a inner portion of higher density crud, called tenacious crud, stuck to the heat transfer surface. The tenacious crud forms on a metal oxide layer of the heat transfer surface, which forms on heat transfer surface due to heating of heat transfer surface (i.e., general corrosion). For example, on fuel element surfaces formed of zirconium, heating results in the increase of a native zirconium oxide layer. The fraction of tenacious crud in the deposit layer increases as crud deposition increases and the crud ages. The densification is accelerated by excessive heat and prolonged exposure to reactor environment.

The sponge-like nature of the deposit layer creates conditions corresponding to capillary water movement. The very low capillary velocities of fluids in crud, creating almost confined conditions, favor the water radiolysis reactions that form the molecular species, i.e. hydrogen, oxygen, hydrogen peroxide and the HO radical. Studies, such as S. Le Caër et al., *Hydrogen Peroxide Formation in the Radiolysis of Hydrated Nanoporous Glasses: A Low and High Dose Study*, Chem. Phys. Lett. 450 (2007) 91-95, have shown that the hydrogen in confined spaces is ineffective in facilitating the recombination reaction to water. Hence, in confined spaces the sum of the oxidizing species, i.e. oxygen, hydrogen peroxide and oxygen radical, effectively create an oxygen saturated environment.

The amount and form of the deposit layer formed on the heat transfer surfaces depends on the concentrations and types of the chemical elements in the water to be converted to steam. The elements are typically in the form of particulate, colloidal and/or ionic species. As the water is converted to steam, the chemical, physical and thermodynamic processes will work in concert (interactively) to produce the evolution of the deposit layer.

Over the years, there have been a number of efforts to understand and model the evolution of the deposit layer and the resulting heat transfer performance. The deposit typically evolves as a porous layer. Heat transfer through the deposit layer is primarily a combination of conduction through the deposit and water matrix and convection through water in the matrix which is converted to steam.

Theories and models have focused on a concept of small capillaries within the porous matrix that conduct water to larger diameter openings called "steam chimneys," where the water is converted to steam. The steam then travels from the steam chimney into the coolant fluid convectively transferring the heat of vaporization. A fixed diameter was used to delineate the openings that were assumed to be capillaries and those that were assumed to be steam chimneys. U.S. Pat. No. 7,420,165 teaches a method of calculating the power transfer of a nuclear component based on a number of steam chimneys in a deposit layer on the nuclear component.

Under most conditions, deposits on heat transfer surfaces make the heat transfer less efficient, and increase the potential for thermal or corrosion damage of the heat transfer surface. Modeling efforts provide a better understanding of the deposition phenomenon and thus help in the development of mitigative and corrective actions.

Although some of the earliest models of deposits on heat transfer surfaces treated the deposit as a layer with a modified coefficient of thermal conductivity, it was soon realized that the transfer of heat through a porous deposit layer was much more complex than simple conduction.

Along these lines, the wick heat transfer model was developed. The wick heat transfer model accounted for the fact that heat transfer in a porous deposit is a combination of conductive and convective heat transfer. The conduction is through the deposit matrix and the convection is from the movement and heating of the coolant fluid within the deposit matrix. The primary convective heat transfer is from the movement of coolant fluid into the deposit matrix where it becomes steam and returns to the coolant fluid.

FIG. 1 shows a version of the wick heat transfer model illustrating a deposit layer 10, which has a thickness X on a heat transfer surface 12. Solutes in the flowing coolant fluid 14 are carried into pores formed in the outer surface 16 of deposit layer 10 by a network of small diameter "capillaries" 18 which fed the fluid 14 into "steam chimneys" 20 where the water was able to absorb the latent heat of vaporization and move back into the fluid 14 as steam. The diameter of a given opening within the deposit layer 10 was used to define whether the path would serve as a capillary 18 supplying fluid 14 or as a steam chimney 20 where the fluid 14 was converted to steam. The smaller diameter openings were capable of wicking the fluid into the hotter regions of the deposit layer 10 without boiling. If the fluid from a capillary 18 connects to the larger diameter of a steam chimney 20, the larger flow opening allows the fluid 14 to flash to steam and flow out to the fluid 14. Any deposit surface openings larger than a specific diameter were counted as steam chimneys 20 and empirical relationships were derived to relate the number of steam chimneys 20 to the heat flux capacity of the deposit layer 10.

SUMMARY OF THE INVENTION

A method of operating a nuclear reactor is provided. The method includes defining a layer increment of a deposit layer modeling a deposit on a heat transfer surface of the nuclear reactor; periodically updating a thickness of the deposit layer by adding the layer increment to the deposit layer; recalculating properties of the deposit layer after each layer increment is added to the deposit layer; determining a temperature related variable of the heat transfer surface as a function of the recalculated properties of the deposit layer; and altering operation of the nuclear reactor when the temperature related variable of the heat transfer surface reaches a predetermined value.

A method of modeling a deposit layer on a heat transfer surface of a nuclear reactor is also provided. The method includes defining a geometry of layer increment of a deposit layer modeling a deposit on the heat transfer surface of the nuclear reactor; periodically updating a thickness of the deposit layer by adding the layer increment to the deposit layer; recalculating properties of each layer increment after each new layer increment is added to the deposit layer; and displaying at least one of the recalculated properties on a display device.

BRIEF DESCRIPTION OF THE DRAWINGS

The present invention is described below by reference to the following drawings, in which.

DETAILED DESCRIPTION

Figure 1:
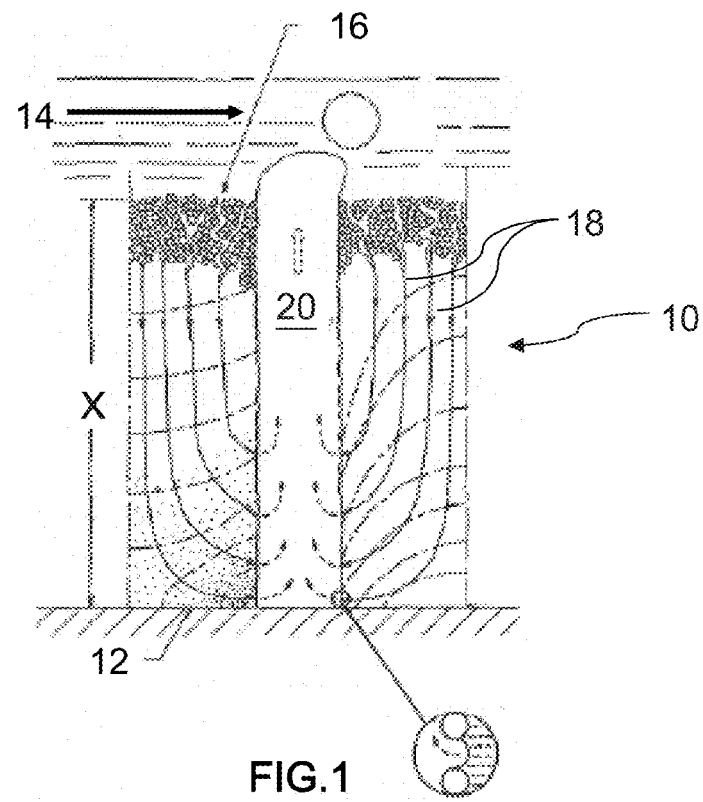
FIG. 1 shows a cross-sectional view of a version of the wick heat transfer model.

Studies of inner and outer surfaces of deposit layers 10, i.e. surface of deposit in contact with a heat transfer surface 12, respectively with a coolant fluid 14, at using image processing software have illustrated that openings in deposits on heat transfer surfaces are more accurately represented as a distribution of different sized channels, rather than as two separate and distinct populations of capillaries and steam chimneys. One such study is Pop et al., *PWR Fuel Deposit Analysis at a B&W Plant with a 24 Month Fuel Cycle*, 15$^{th}$ International Conference on Environmental Degradation of Materials in Nuclear Power Systems—Water Reactors, Aug. 7 to 11, 2011. The physics and chemistry of the system determine which channels within the deposit layer 10 are large enough to allow the escape of steam and which pores are small enough to provide the capillary driving force to draw water into the region of the deposit layer where it is converted to steam. The chemical and heat transfer processes involved determine the evolution of the deposit layer porosity and structure as more water is drawn in to the deposit layer 10 and converted to steam.

Modeling deposit layers 10 on heat transfer surfaces 12 according to embodiments of the present invention use a population of channels whose members are defined in terms of a quantity and an initial radius. The deposit layer 10 is defined in terms of an area of heat transfer surface 12, for example a square meter. For each new layer increment, the population membership is constructed using a minimum radius and a radius increment to determine the member radii and quantities such that the summed total area of the entire channel population does not exceed the defined area of the heat transfer surface times the thickness of the layer increment. This approach more closely represents the observed deposit structure and yields more realistic initial porosity and solid fraction values for each new layer increment.

The deposit model considers the evolution of the deposit layer 10 to be an ongoing process. As particulates in the coolant fluid 14 in contact with the heat transfer surface 12 attach to the heat transfer surface 14, the thickness of the deposit layer 10 grows. As the deposit structure forms, the fluid 14 and contained species continue to be drawn into the deposit layer 10 and the fluid to be converted to steam. As the fluid 14 within a deposit channel is converted to steam, some of the contained species precipitate and the channel may reach a minimum radius at which the channel is not able to carry the same substances out of the deposit. This continued deposition within the deposit structure reduces the open volume in the channels where the fluid is converted to steam. Over time, the layer increments of the deposit that are closer to the heat transfer surface 12 continue to become less porous due to the continued deposition of particulate, colloidal and ionic substances from the fluid 14.

From known measurements on the surface of the deposit in contact with the coolant fluid 14, there is a population of openings which can be characterized as a distribution. Since this population will be the most recently formed deposit structure, it is used to define a typical starting condition for each layer increment in the deposit model.

Figure 2:
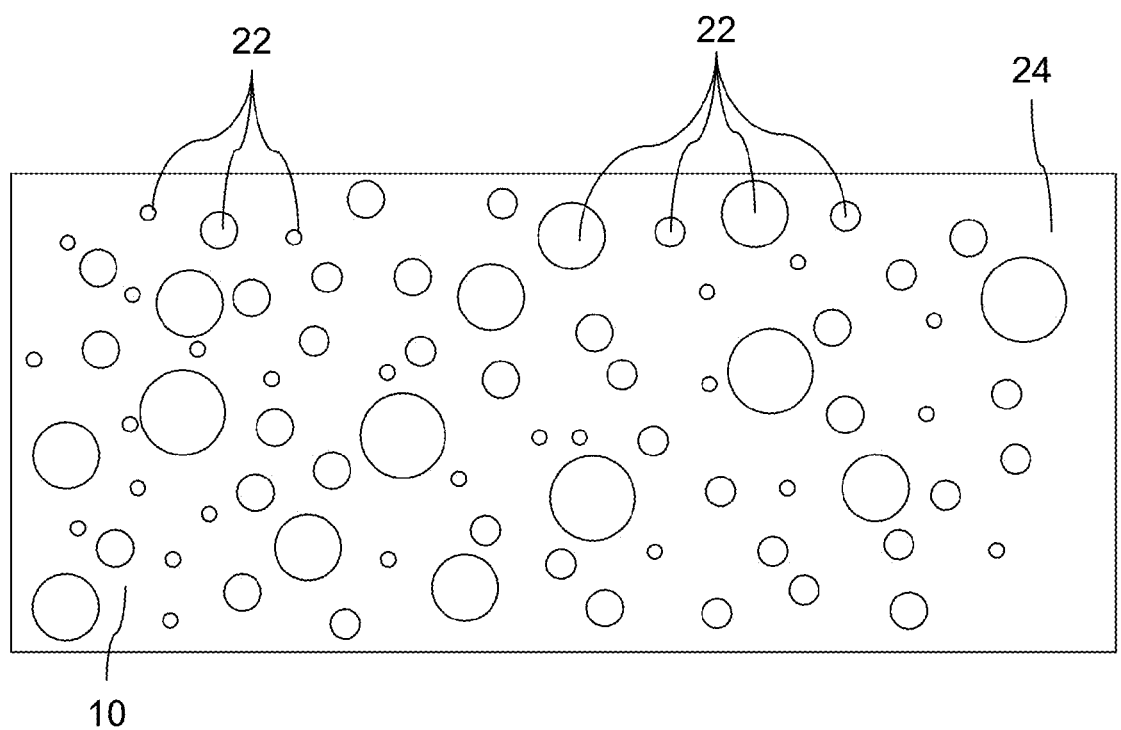
FIG. 2 shows a plan view of an example of a distribution of different size channels in an actual deposit layer increment.

The deposit model is based on an observed distribution of deposit openings on the coolant fluid boundary of the deposit layer 10, for example using a Scanning Electron Microscope (SEM) as described for example in U.S. Pat. No. 7,822,259. FIG. 2 shows a plan view of an example of a distribution of different size channels 22 in a deposit layer increment 24 as it may be observed on an actual flake of a deposit layer 10 removed from a heat transfer surface of a nuclear reactor. As shown in FIG. 2, the channels 22 vary in diameter throughout layer increment 24. The channels 22 in combination with the local heat flux and chemistry conditions determine the thermal hydraulic functioning of the different openings.

Figure 3:
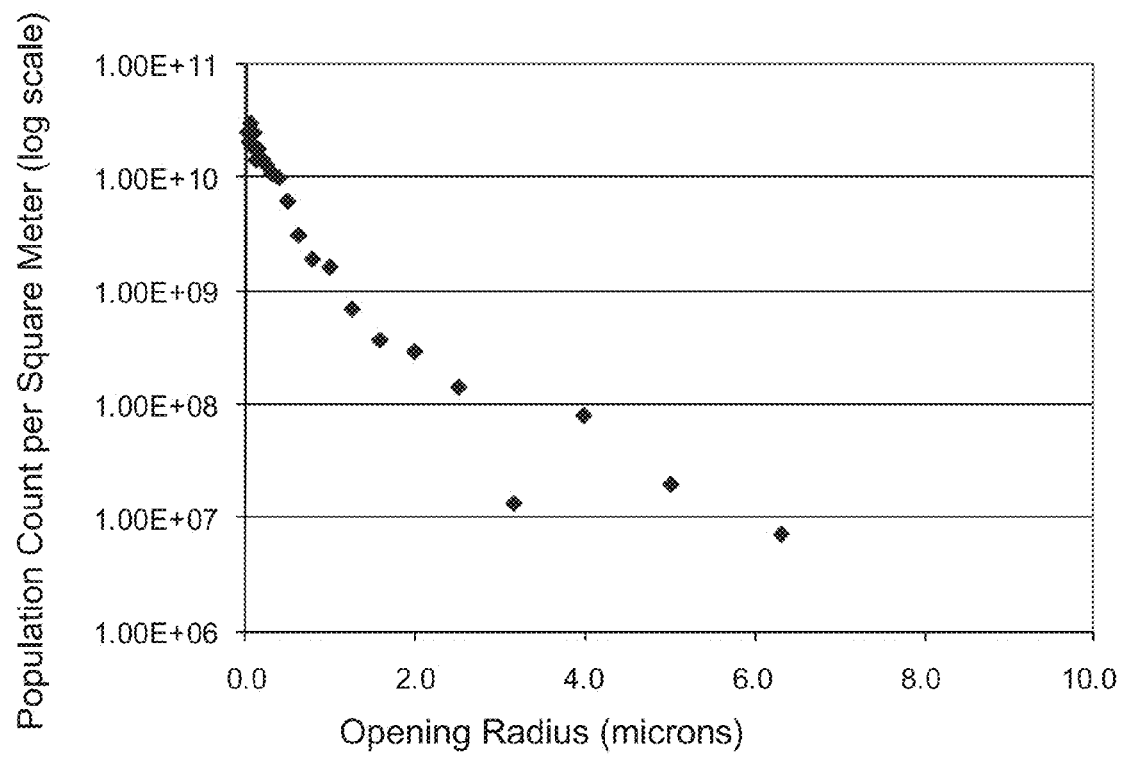
FIG. 3 shows an exemplary plot of mean actual observed population data of a distribution for use in creating a modeled deposit layer increment according to the invention.
Figure 4:
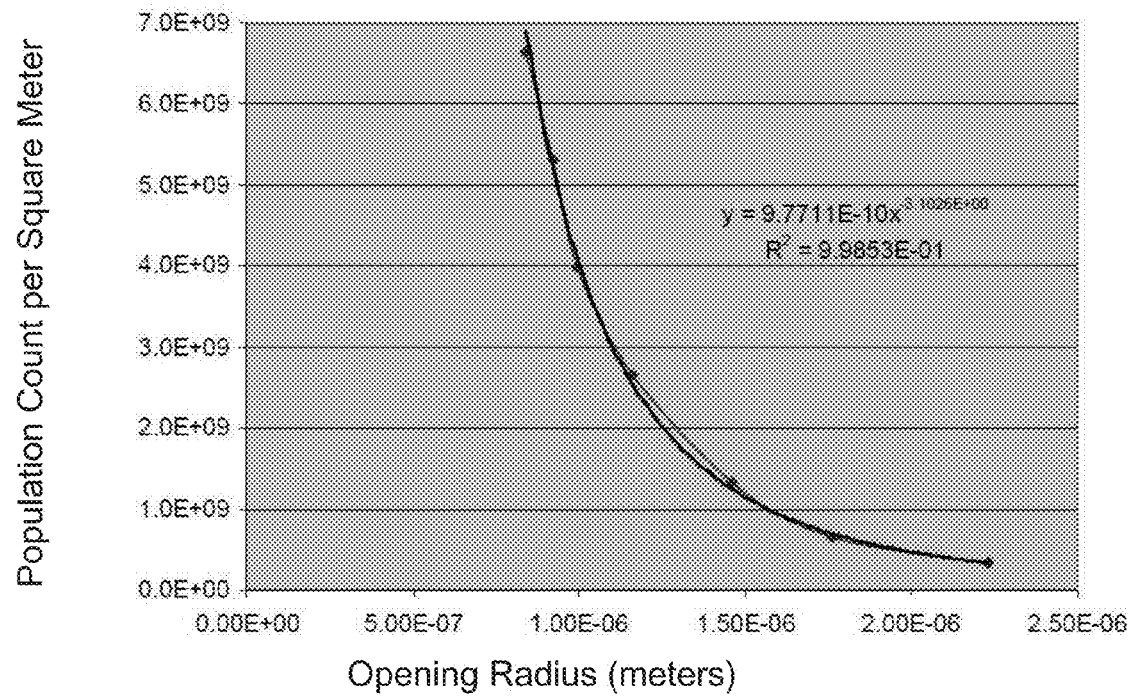
FIG. 4 shows a regression curve calculated for a portion of the exemplary plot of FIG. 3.

FIG. 3 shows an exemplary plot of actual observed population data of a distribution for use in creating a model of a deposit layer increment. The plot shows the population of channels 22 for each sized radius in the distribution. As shown in this example, the majority of the channels 22 have a radius that is less than 2 microns. Different population distributions are applied if the observed deposit flake conditions are different. FIG. 4 shows an enlarged view of a portion of the exemplary plot of FIG. 3 around 1 to 2 microns with the corresponding calculated regression curve.

In the deposit model, each new layer increment 24 is added on top of the previous layer increments 24, adjacent to the coolant fluid 14, and starts with the porosity and physical structure defined by the observed porosity of an outer layer of an actual deposit sample, such as for example structure represented by the distribution shown in FIG. 3. Flow of the coolant fluid 14 into the older layer increments 24 continues through the smaller channels 22 (those acting as capillaries). The fluid flashes to steam in the larger channels 22 (those acting as chimneys) leaving behind most of the substances, the insoluble species, that were in the fluid 14 and the initially soluble species transformed to insoluble species due to the localized conditions. The continued deposition within these larger channels 22 reduces the open volume. This process of consolidation results in the reduction of the porosity of the layer increment 24 from its initial condition. The radius of the larger channels 22 is reduced by deposition within the channels 22. Since the effect is cumulative, the porosity reduction will be more significant in the older layer increments 24 (nearest the heat transfer surface 12). The rate of the deposit buildup is a function of the coolant fluid chemistry and the heat flux.

Due to the thermodynamics of the deposit layer 10, there is a limit on the smaller radius of a channel within the deposit. When the channel becomes too small to allow the coolant fluid to convert to steam, the rate of deposition slows or stops. Thus there is a minimum radius limit from which channels are considered to act as chimneys.

Figure 5:
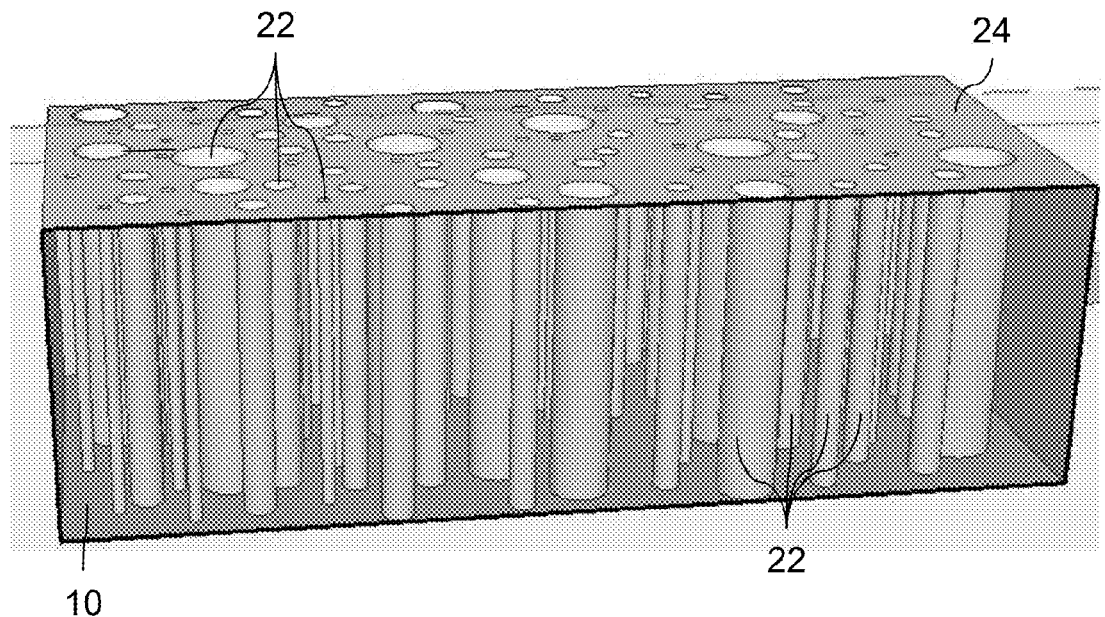
FIG. 5 schematically shows a perspective view of a representation of layer increment of the deposit layer according to the invention.
Figure 6:
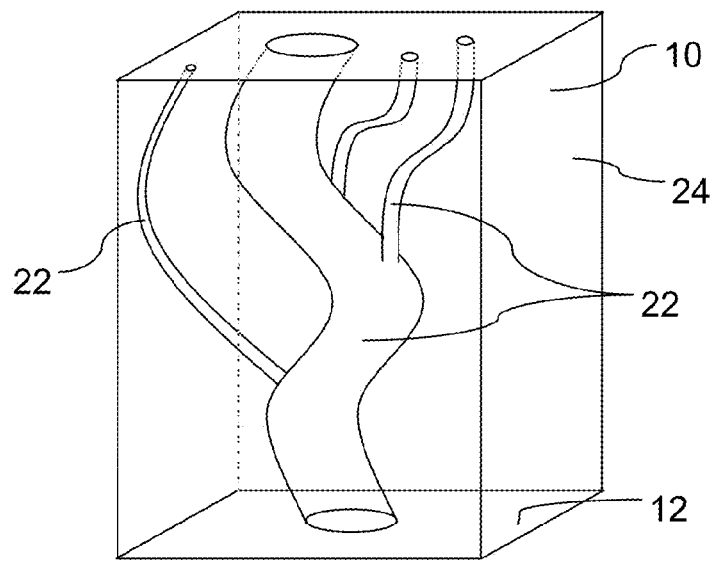
FIG. 6 schematically show channels as irregular open volumes.

FIG. 5 schematically shows a perspective view of a representation of deposit layer increment 24 of the deposit layer 10, which for example could have a thickness on the order of 1 micrometer depending on the model parameters. It should also be noted that the actual channel diameter and number of channels 22 in a layer increment 24 would be consistent with the channels 22 represented in FIG. 3. FIG. 5 illustrates the channels 22 as being completely cylindrical throughout their length; however, each channel 22 has some tortuosity on a macro scale as illustrated in FIG. 6 with diameter variations such that channels 22 are modeled in the deposit model as being irregular open volumes, not perfect cylinders. As a layer increment 24 of the deposit layer 10 is modified over time, the tortuosity effect may be increased. Adding material to an irregular open volume changes the direction of capillary flow or steam evacuation through those free spaces, resulting ultimately in a longer fluid or steam path until the exit point.

Figure 7A:
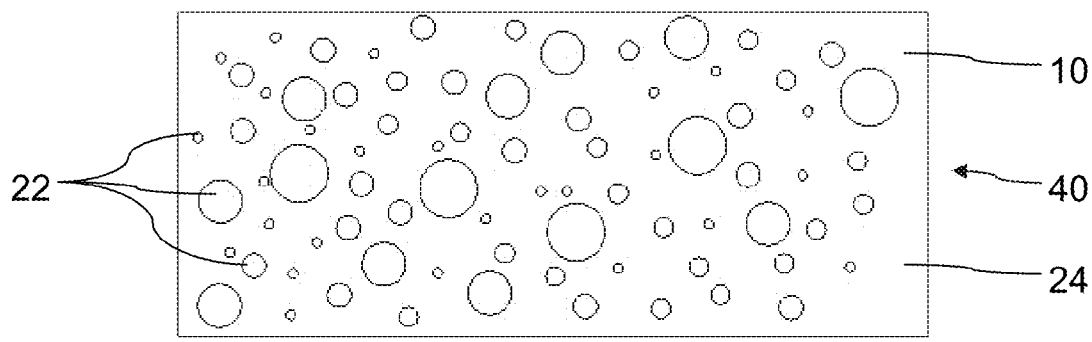
FIGS. 7a to 7c shows the evolution of layer increments by illustrating plan views of three different layer increments of a deposit model.
Figure 7B:
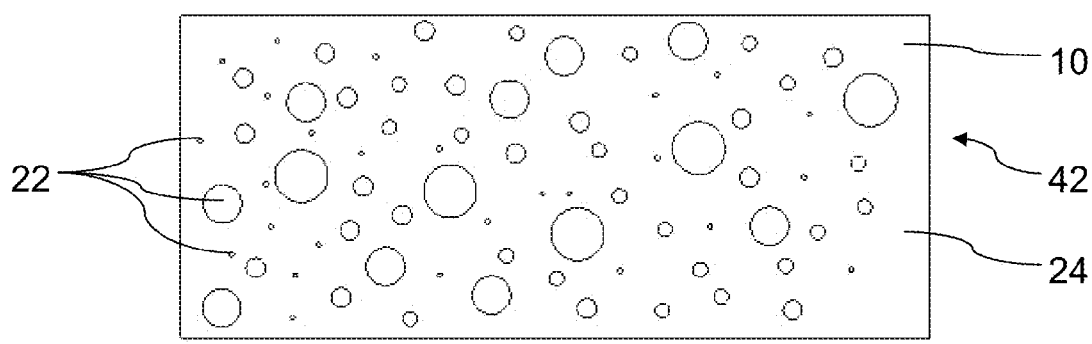
Figure 7C:
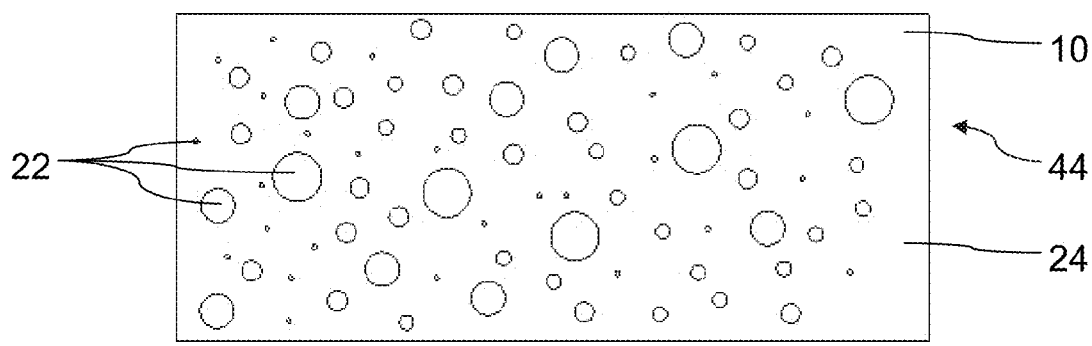

FIG. 7 shows the evolution of the layer increments 24 by illustrating plan views of three different layer increments 24 of a deposit layer 10. The top illustration shows a top or newest layer increment 40, recently formed on the outer surface of the deposit layer 10 in contact with the fluid 14. The middle illustration shows a middle deposit layer increment 42, which is approximately located halfway between the newest layer 40 and the heat transfer surface 12. The bottom illustration shows a bottom or oldest deposit layer increment 44 formed directly on the heat transfer surface 12. These three layer illustrations show the channels 22 in the deposit layer 10 reduce in radius due to further deposition within the layer increments until each channel achieves a minimum radius.

Figure 8:
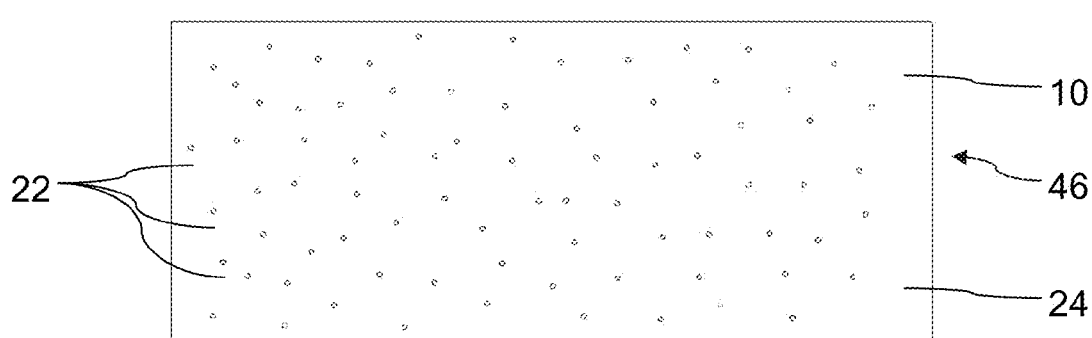
FIG. 8 shows a layer increment in which each channel has achieved the minimum radius because of the high concentrations of species in the layer increment.

FIG. 8 shows a layer increment 46 in which each channel 22 has achieved the minimum radius because the high concentrations of deposited substances in the channels 22 of the layer increment 46. In this case, the layer increment 46 will be primarily a conduction layer and the heat transfer of this particular layer increment 46 is thus at a minimum.

Figure 9:
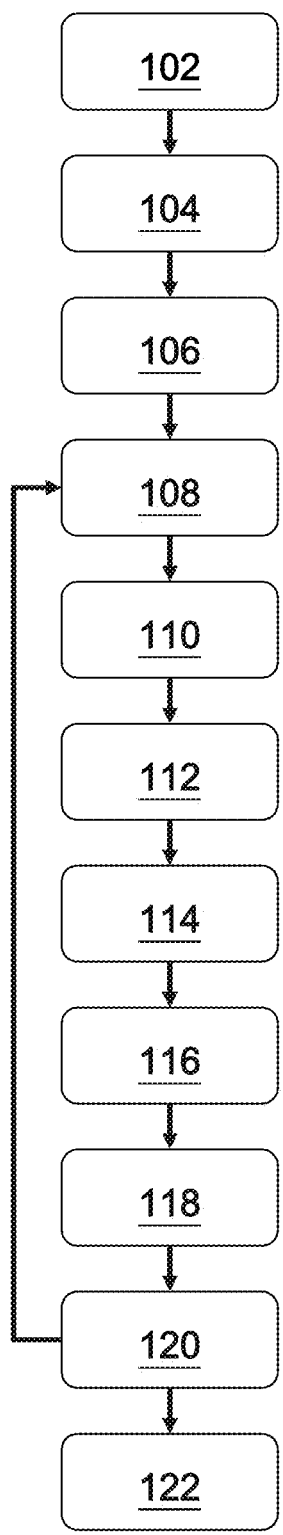
FIG. 9 shows a flow chart illustrating a method of operating a nuclear reactor in accordance with an embodiment of the present invention.

FIG. 9 shows a flow chart illustrating a method of operating a nuclear reactor in accordance with an embodiment of the present invention. In a step 102, an actual deposit sample is obtained from the heat transfer surface of a nuclear reactor, for instance a fuel element (i.e., a fuel rod or fuel pin) or a steam generator tube. In a step 104, the actual deposit sample is analyzed using a SEM to determine the porosity of the deposit sample. Specifically, the actual crud deposit sample is analyzed to determine the porosity of a layer segment of the deposit sample. In a preferred embodiment, the layer segment is an outer layer segment of the deposit sample, which formed a surface of the deposit interacting with coolant fluid in the reactor core. For example, the layer segment may be one micrometer thick.

A model of an actual deposit forming on heat transfer surface is initiated by a computer. The computer builds the modeled deposit layer 10 in layer increments 24 which allow a quasi-static equilibrium analysis process that follows the formation of the actual deposit in the core of an actual operating nuclear reactor. The model may maintain the quasi static equilibrium condition by assuming that the heat available at the heat transfer surface 12 is transferred through the modeled deposit layer to the coolant fluid 14. While an exception may be granted during short transient periods, the system adapts to transfer the available heat. The adaptation is typically in the form of an increased temperature at the heat transfer surface 12 until the layer is again capable of transferring all of the heat away from the heat transfer surface 12. The combined conduction and convection of the modeled deposit layer 10 are equal to the input heat flux. The model in this embodiment used an iterative equilibration of thermal hydraulic, chemical and physical deposition balances over a defined operational period. By using small time and volume increments the modeled deposit layer 10 is maintained near a quasi-equilibrium state as the deposit is formed and as the density of the older layers, those closest to the heat transfer surface 12, increases.

In a step 106, the computer defines the geometry of a layer increment 24 of the modeled deposit layer 10 by setting an initial channel population for the layer increment 24 based on the porosity of layer segment analyzed by SEM. The defined layer increment 24 is used to start each new layer increment 24 added to the modeled deposit layer 10. An exemplary embodiment of numerical values for the initial channel population in shown in FIG. 3, which defines the initial channel population in the number of channels 22 and the radii of the channels 22. Depending on the minimum radius and radius increment of the initial channel population, which may be arbitrarily set to reasonably represent the layer segment of the actual deposit, the computer may create layer increments 24 so each new layer increment 24 has an initial porosity, i.e., a fraction of volume of voids over the total volume, between 0.90 and 0.95, which is in agreement with observed SEM data. The example of FIG. 3 uses a minimum radius of 3.0 E-7 meters and a radius increment of 2.5 E-8 meters to yield a discrete population distribution of fifty three (53) different channel radii with the maximum radius of 1.625 E-6 meters and a porosity of 0.91.

After the layer increment 24 is defined, the computer initiates an iterative process to model the growth of the actual deposit on the heat transfer surface of the fuel rod over time. Each layer increment 24 is defined as composed of a porous matrix consisting of water, solids and a distribution of open channels 22. The porous matrix will transfer heat by conduction through the combined solid and liquid matrix. The open channels 22 will transfer heat through evaporation of liquid oozing on their interior surfaces and the subsequent convective transfer through evacuation of the resulting steam.

Thus each layer increment 24 consists of three phases—solid, liquid and vapor—of material in proportions determined by the model. The porous solid of the deposit layer 10 forms the physical matrix of the layer. The liquid material permeates the porous solid and the smaller channels 22 conduct liquid into the matrix. The larger channels 22 contain the steam component of the material. The volumetric proportions of each phase evolve over time as the model iteration progresses. This balance between solid, liquid and vapor is used to determine the heat transfer of the combined deposit mass. As the model iteration continues, new layer increments 24 are added and the older layer increments continue deposition and reduction of the channel radii (or diameters) until the minimum radius is reached.

The model then iterates the process of waiting until the deposit layer 10 grows by an amount having the thickness of a layer increment 24, creating the layer increment 24 based on the observed open structure and porosity, calculating the temperature profile across the full deposit layer thickness, determining the deposition within the openings of the previous layer increments 24 and determining the new chemical equilibrium conditions for the full deposit layer 10. This iteration is continued for a specified duration and used to monitor at least one temperature related variable of the heat transfer surface 12 to ensure that the heat transfer surface is not heated to a dangerously high value.

More specifically, a preferred embodiment of the modeling operates in accordance with the following steps 108 to 120.

In a step 108, after a sufficient amount of time has elapsed that the computer estimates a deposit thickness equal to the layer increment thickness has been added to the heat transfer surface 12, the computer adds a layer increment 24 having the predefined geometry to the deposit layer 10. Initially, during a first iteration, a first layer increment 24 of the deposit layer 10 representing an initial layer segment formed directly on the heat transfer surface 12 of the nuclear reactor is formed. During a second iteration by the computer, a second layer increment 24 of the deposit layer 10 is formed on the outer surface of the first layer increment 24 in contact with the fluid 14. For each subsequent iteration of step 108, an additional layer increment 24 is added to the deposit layer 10.

Next, in a step 110, the computer uses a composition of solid species in the coolant fluid 14 to define the composition of solid species in each of the layer increments 24 of the deposit layer 10. The solid species are elements in the form of particulate, colloidal and/or ionic substances in the coolant fluid 14 that are attracted to the heat transfer surface 12 of the nuclear reactor. An increase of temperature difference between the heat transfer surface 12 and the coolant fluid 14 increases the rate of attraction of the solid species to the heat transfer surface 12. The deposition of the species is a function of the heat flux of the heat transfer surface 12, which for instance is dependent on the heat generated by the heated surface, the heat transfer of the deposit layer 10, and the temperature of the coolant fluid 14.

In a step 112, the computer uses the temperature and pressure of the layer increments 24 to define a temperature profile of the deposit layer 10 for a full thickness of the deposit layer 10, layer increment 24 by layer increment 24. Each layer of deposition has its own internal steam pressure. The pressure is higher on layers closer to the heated surface, which makes the steam to be evacuated towards water at the surface of the deposition. There, the pressure is approximately equal (slightly higher) to the pressure in the bulk cooling fluid. The temperature profile is calculated inside each layer increment 24 using a given distribution of channels 22 acting as steam chimneys (steam evacuation members) that evacuate heat out of the deposit layer 10 to the coolant fluid 14. The distribution of channels 22 changes layer increment 24 by layer increment 24. For example, the temperature profile may be based on the number of channels 22 in the deposit layer increment 24 having a radius greater than a predefined limit at which a channel 22 acts as a steam chimney, drawing in coolant fluid from capillaries, heating the fluid and outputting it into the coolant fluid 14 as steam. The temperature profile is dependent upon the amount and composition of the solid species forming each layer increment 24 and the heat flux of the heat transfer surface.

In a step 114, the computer uses the temperature profile determined in step 112 for each layer increment 24 and a pressure calculated for each layer increment to define the chemical equilibrium conditions of the deposit layer, layer increment by layer increment. During step 114, the computer determines the solubility and diffusivity of the different species in deposit layer 10 and in the solute within the channels 22 of the deposit layer 10. In other words, soluble species concentrations (as hydroxides) in the deposit layer 10, i.e. in each layer increment 24 of the deposit layer 10, and their diffusivity are determined. The diffusivity depends on the soluble species in each layer increment 24 and the temperature profile in each layer increment 24, as determined in step 112. Defining the chemical equilibrium conditions involves calculating the hydroxide forms of the soluble species deposited as insoluble species into the layer increments 24 of deposit layer 10 and the diffusivity coefficients of each liquid hydroxide form. The diffusivity and the solubility of the species in the deposit layer 10 are used to define the chemical equilibrium by determining the conversion of soluble species into insoluble species and the deposition of the insoluble species into the layer increments 24.

In a step 116, the computer uses the chemical equilibrium established in step 114 to redefine the distribution of the species in the deposit layer 10 to determine the actual deposition of the soluble species within the deposit layer 10. The amount and composition of the solid species in the layer increments 24 as determined in step 110 and the amount and composition of the insoluble species in the layer increments 24 as determined in step 114 are summed together. The computer calculates the mass balances of elements (e.g., Fe, Zn, Si and Cu) as hydroxides (e.g., in parts per million) in each layer increment 24, based on the capillary movement of the species towards evacuation through the steam and the diffusion to and from neighboring layer increments 24. The deposition of the soluble species transformed to insoluble species due to the localized conditions in the layer increments 24 occurs within the channels 22 acting as chimneys (but not within the channels acting as capillaries). Accordingly, the amount of deposition within each layer increment 24 depends on the number and volume of the channels 22 acting as chimneys. When the channel 22 acting as a chimney becomes too small to allow the coolant fluid 14 to convert to steam, the rate of deposition within the channel 22 slows or stops, causing the channel 22 to act as a capillary. If channel 22 acting as a chimney experiences a reduction in radius so as to have a smaller radius than an adjacent channel 22 acting as capillary, the adjacent channel 22 acting as a capillary may be forced to act as a chimney. Thus, chimneys may be converted to capillaries and capillaries may be converted to chimneys. Ultimately, the computer may calculate the deposition rate of the species, which may include $Zn_2SiO_4$, $ZnO$, $CuO$ and $SiO_2$, in grams/second, to determine the total deposition of species in each layer increment 24 during each iteration.

In a step 118, the computer uses the deposition of the species in each layer increment 24 to recalculate the geometry of the deposit layer 10. The volumes of the insoluble species are distributed in the channels 22 of each layer increment 24 to redefine the geometry of the full deposit layer 10. The porosity and the radiuses of the channels 22 acting as chimneys are decreased by the computer. As coolant fluid is converted to steam within a layer increment 24, soluble species which are transformed to insoluble species due to local conditions within each layer increment 24 are left behind in the steam chimneys reducing the diameter of the chimneys and reducing the overall porosity of the layer increment 24. The volume of the combined species deposited in each layer increment 24 contributes to changing the free volume by decreasing the porosity of layer increments 24.

In a step 120, based on the recalculated geometry of the deposit layer 10, at least one temperature related variable of the heat transfer surface 12 of the nuclear reactor is determined and compared to a corresponding limit. Increased buildup of the actual deposit on the heat transfer surface affects the ability of the coolant fluid to cool the heat transfer surface. If the temperature related variable of heat transfer surface 12 reaches the predetermined limit, operation of the actual nuclear reactor is altered. The modeling then returns to step 108 and proceeds through the iterative loops of steps 108 to 120 to add another layer increment 24 to the deposit layer 10 and recalculate the properties of the deposit layer 10 and the temperature of the heat transfer surface 12. As used herein, temperature related variable of the heat transfer surface 12 includes the temperature of the heat transfer surface 12 or any variable that is dependent on the temperature and thus may be considered an indirect measure of the temperature of the heat transfer surface 12. For example, the thermal expansion of the cladding material is an indirect measure of the temperature of the heat transfer surface 12 and is a temperature related variable.

In order for the nuclear reactor to be safely operated, the temperature of the heat transfer surface 12 is kept below a predetermined value. Once the layer increments 24 of layer 10 deposited on the heat transfer surface 12 cause the temperature of the heat transfer surface 12 to reach the predetermined value (or another temperature related variable reaches the corresponding limit), at a step 122, operation of the nuclear reactor is altered, either automatically by a computer system programmed to monitor and control the nuclear reactor in accordance with the above steps or by an operator of the nuclear reactor. In some instances, altering the operation of the nuclear reactor may include stopping operation of the nuclear reactor and then replacing the heat transfer surface 12. For example, in a nuclear reactor, once the temperature on a hottest point of a hottest nuclear fuel element reaches the predetermined value, the nuclear reactor is stopped, the fuel elements are removed from the nuclear reactor and replacement fuel elements are inserted into the nuclear reactor. The nuclear reactor may be restarted with the replacement fuel elements.

In other instances, altering the operation of the nuclear reactor may include operating the nuclear reactor at modified conditions. Once the temperature related variable of the heat transfer surface reaches the predetermined value, the operability of the reactor may be compromised and a region of the boundary of the heat transfer surface may be at a high risk of failure. In such situations, it may be possible to suppress operation of the region of the heat transfer surface having a high risk of failure. For example, in a nuclear reactor, once the temperature related variable of the heat transfer surface reaches the predetermined value, the boundary of the hottest nuclear fuel element may be at a high risk of failure (i.e., the cladding has a high risk of breaking) and the nuclear reactor may be operated in a high risk mode. The hottest nuclear fuel element may then be suppressed by limiting for instance the nuclear reactor power.

Figure 10:
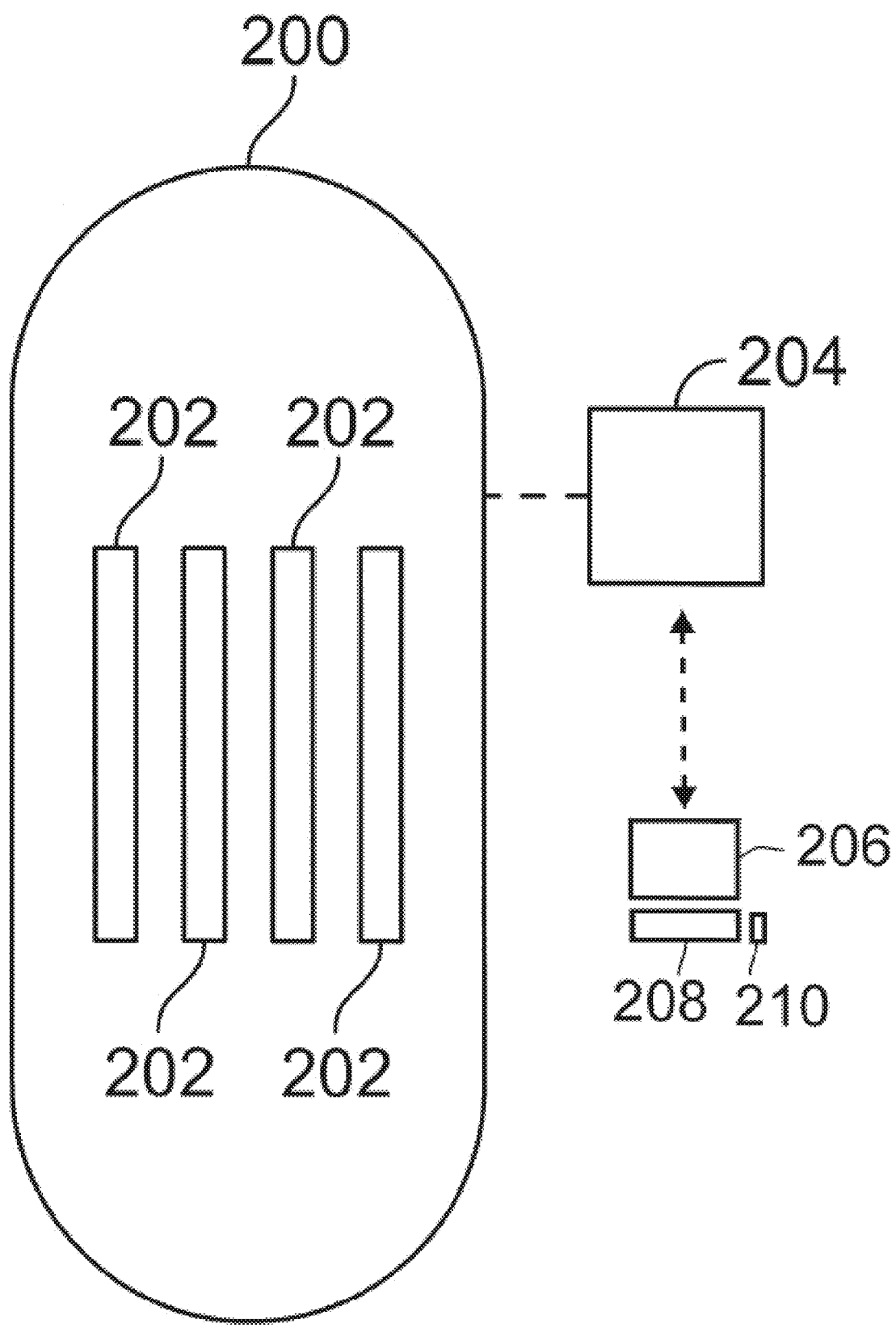
FIG. 10 schematically shows a nuclear reactor operated in accordance with an embodiment of the present invention.

FIG. 10 schematically shows a nuclear reactor 200 operated in accordance with an embodiment of the present invention. Nuclear reactor 200 includes a plurality of schematically shown fuel elements 202 in its core. A controller 204 is provided for operating nuclear reactor 200 in accordance with a non-transitory computer readable media programmed or structured to define modules having logic for performing the steps described with respect to the method of FIG. 9. The non-transitory computer readable media includes computer executable process steps operable to control controller 204 in accordance with the method described with respect to FIG. 9.

Controller 204 may be in wired or wireless communication with a display device 206 and at least one user input device, for example a keyboard 208 and a mouse 210. Display device 206 may also be a touchscreen display that may be used as an additional or alternative user input device. Display device 206 may display graphic user interfaces illustrating the values used in the method to the user and allowing the user to alter the values.

Figure 11:
FIG. 11 shows an exemplary graphic user interface displaying inputs a chemistry module may use to define a layer increment.

A first exemplary graphic user interface is shown in FIG. 11, which displays inputs that a chemistry module may use in steps 110 or 114 to define the chemical equilibrium of the deposit layer 10. As shown in FIG. 11, the inputs used in step 110 or 114 may include the total, dissolved and solid particles of substances in the coolant fluid 14 (e.g., for example iron, zinc, silicon and copper) and the content of the coolant fluid 14 (e.g., $H_2O_2$, $H_2$, $O_2$ and oxide content). The inputs may be automatically generated by the chemistry module or may be input or altered by the user via one or more of the user input devices.

Figure 12:
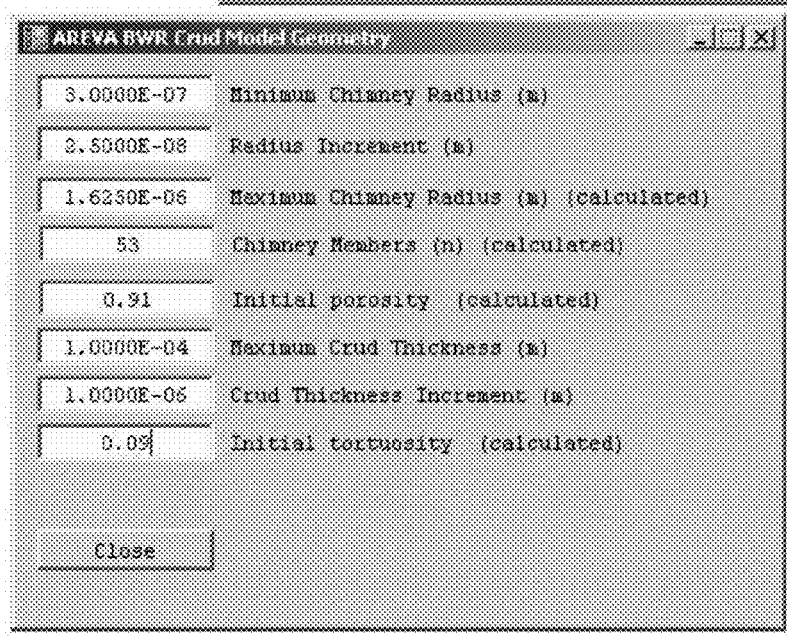
FIG. 12 shows an exemplary graphic user interface displaying inputs a geometry module may use to define the chemical equilibrium of a deposit layer.

A second exemplary graphic user interface is shown in FIG. 12, which displays inputs that a geometry module may use in steps 106 or 118 to define a layer increment. In FIG. 12, chimney means channel 22, Crud means deposit layer 10, Crud increment means deposit layer increment 24. As shown in FIG. 12, the inputs used in step 106 or 118 may include the minimum channel radius for the defined layer increment 24, the radius increment for the defined layer increment 24, the maximum channel radius for the defined layer increment 24, the number of channel members for the defined layer increment 22, the initial porosity for the defined layer increment 22, the maximum deposit layer thickness (i.e., crud thickness) of the modeled deposit, the thickness of each defined layer increment 24 and the initial tortuosity for the defined layer increment 24. The maximum deposit layer thickness is the limit on the thickness of the entire deposit. The operator programs controller 204 to set this value to exceed a maximum estimated thickness of the entire deposit. If the calculated value of the thickness of the entire deposit exceeds the maximum deposit layer thickness, controller 204 will abort the modeling of the deposit layer. The inputs may be automatically generated by the geometry module or may be input or altered by the user via one or more of the user input devices.

Figure 13:
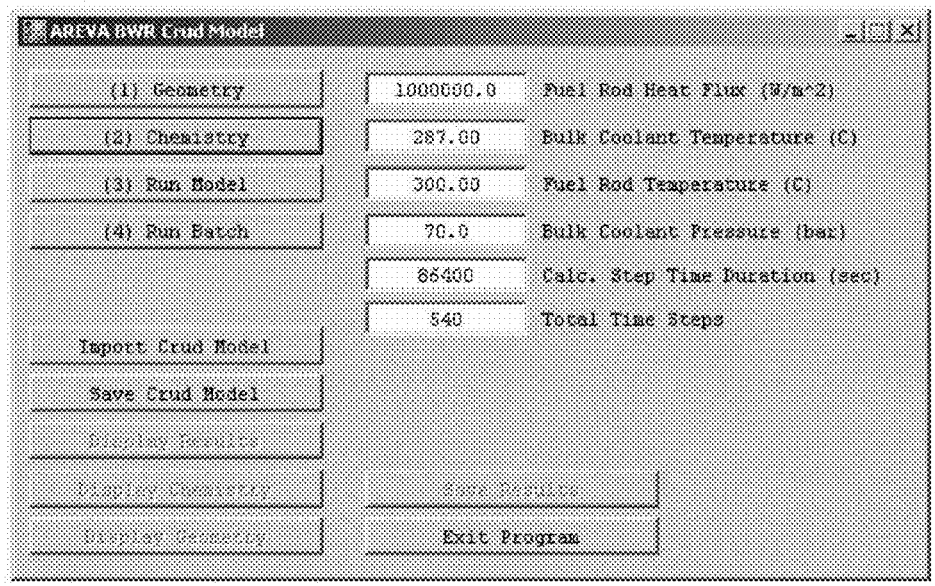
FIG. 13 shows an exemplary graphic user interface displaying the values for reactor core parameters and the modeling parameters for a deposit layer.

A third exemplary graphic user interface is shown in FIG. 13, which displays the values for the reactor core parameters (i.e., fuel rod heat flux, coolant fluid temperature, fuel rod temperature, coolant fluid pressure) and the modeling parameters (i.e., time step duration of each iteration and total time steps, which is the amount of days the nuclear fuel will be within the reactor) that may be used in steps 108 to 120. The inputs may be automatically generated or may be input or altered by the user via one or more of the user input devices.

Steps 108 to 120 are performed using mathematical representations stored on the computer readable medium. Numerical values used in steps 108 to 120 are defined as constants, lookup tables or curve fits that can avoid the interpolations required for a lookup table.

Figure 14:
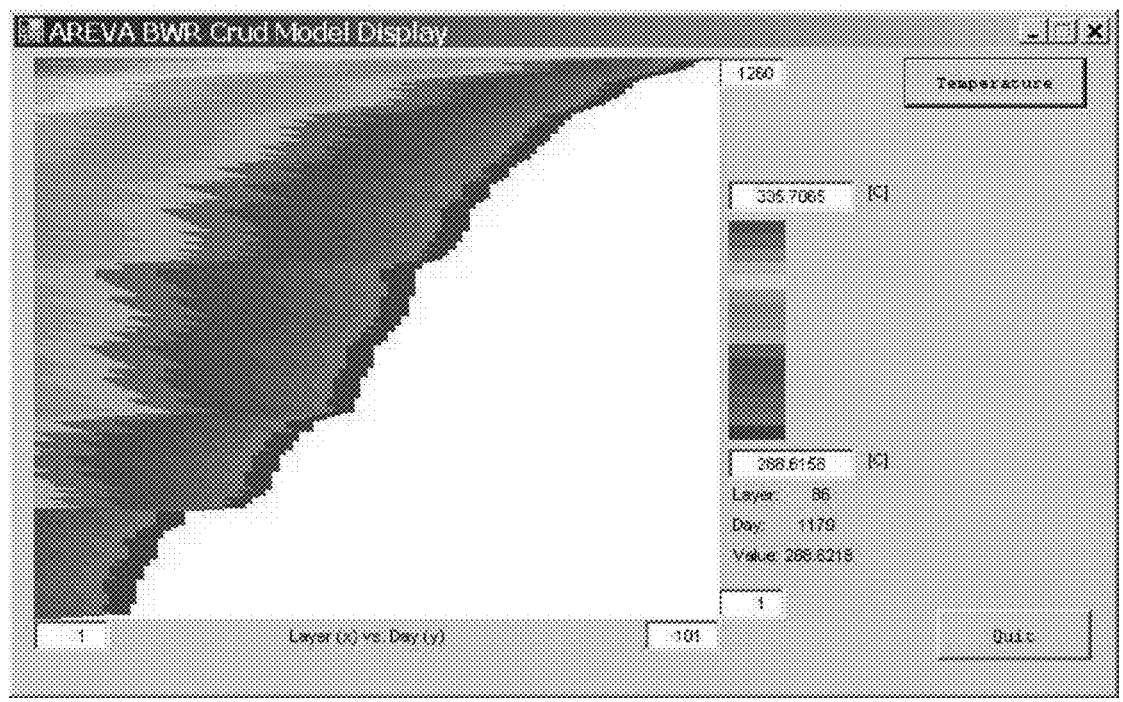
FIGS. 14 to 24 show graphical interfaces that illustrate the evolution of exemplary properties of each layer increment over time.
Figure 15:
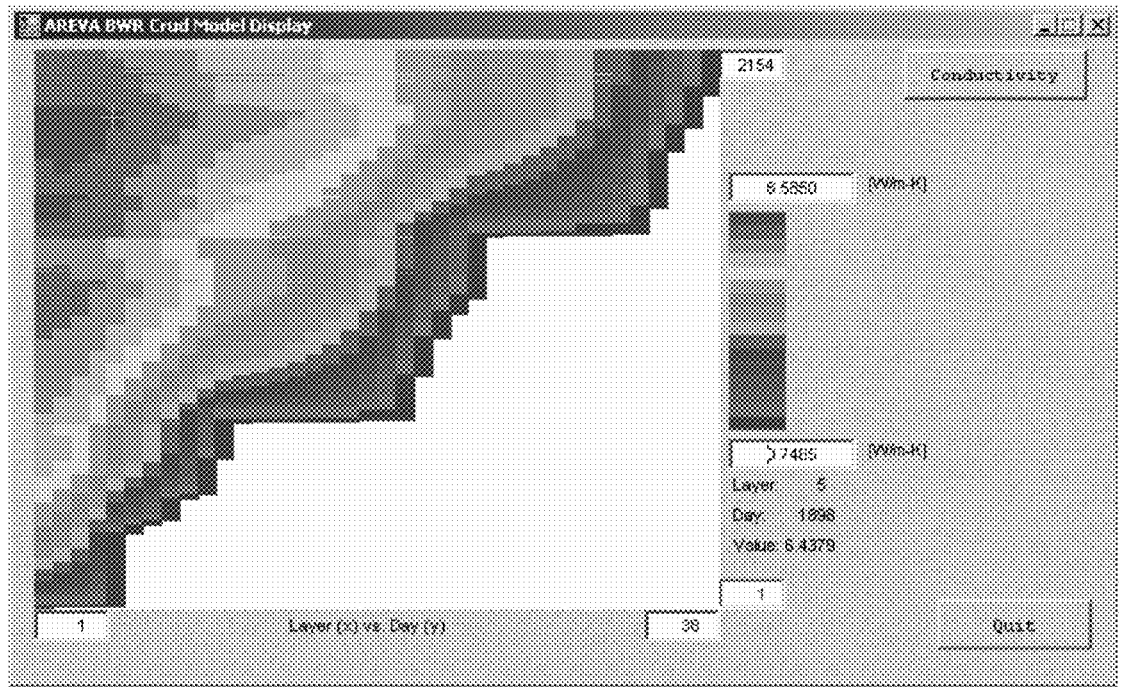
Figure 16:
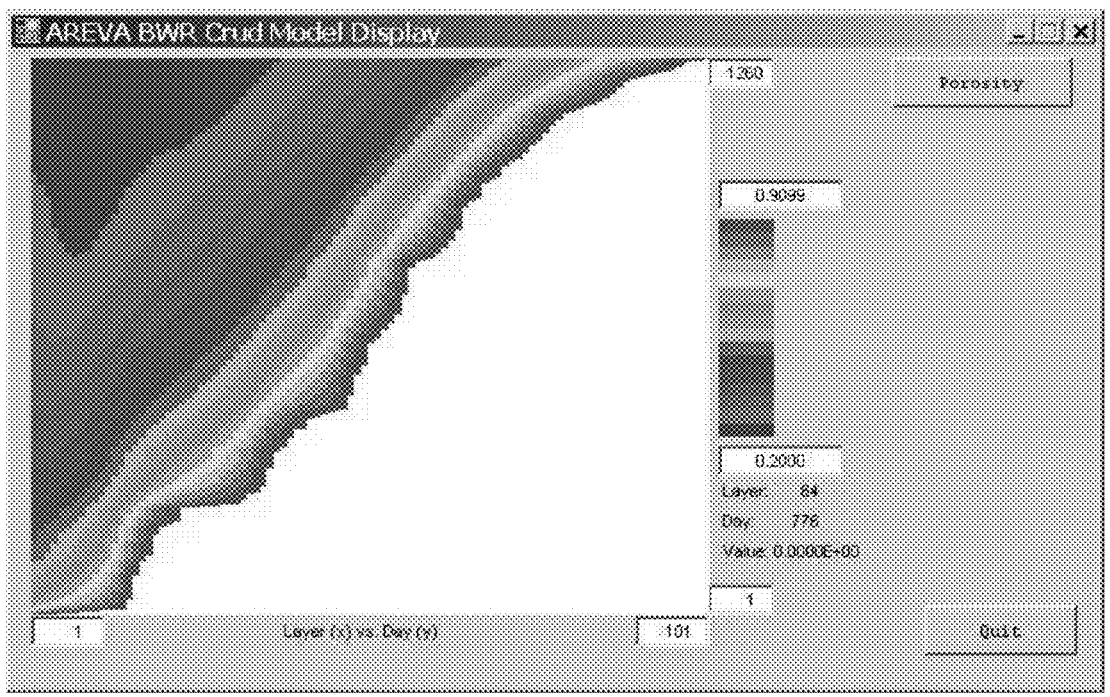
Figure 17:
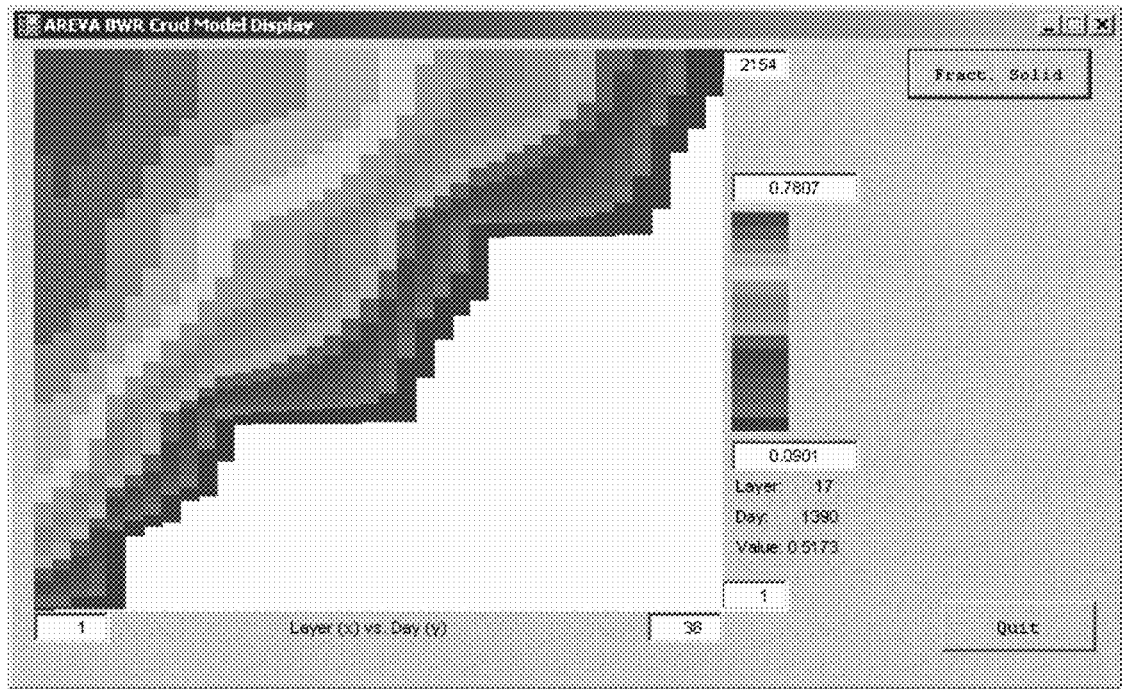
Figure 18:
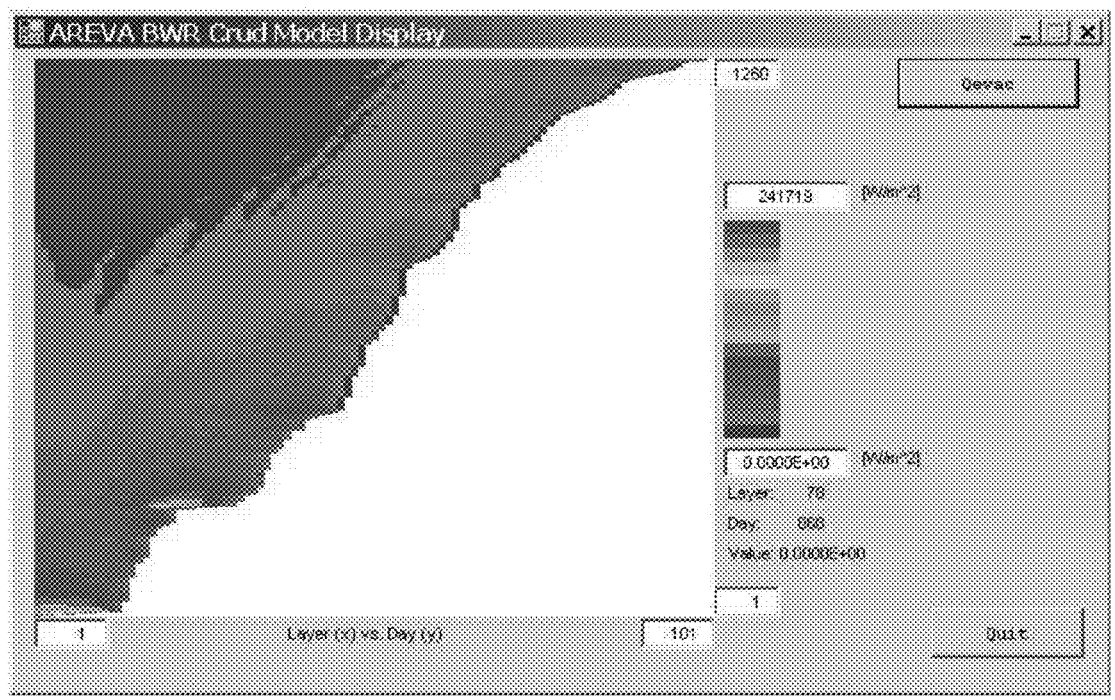
Figure 19:
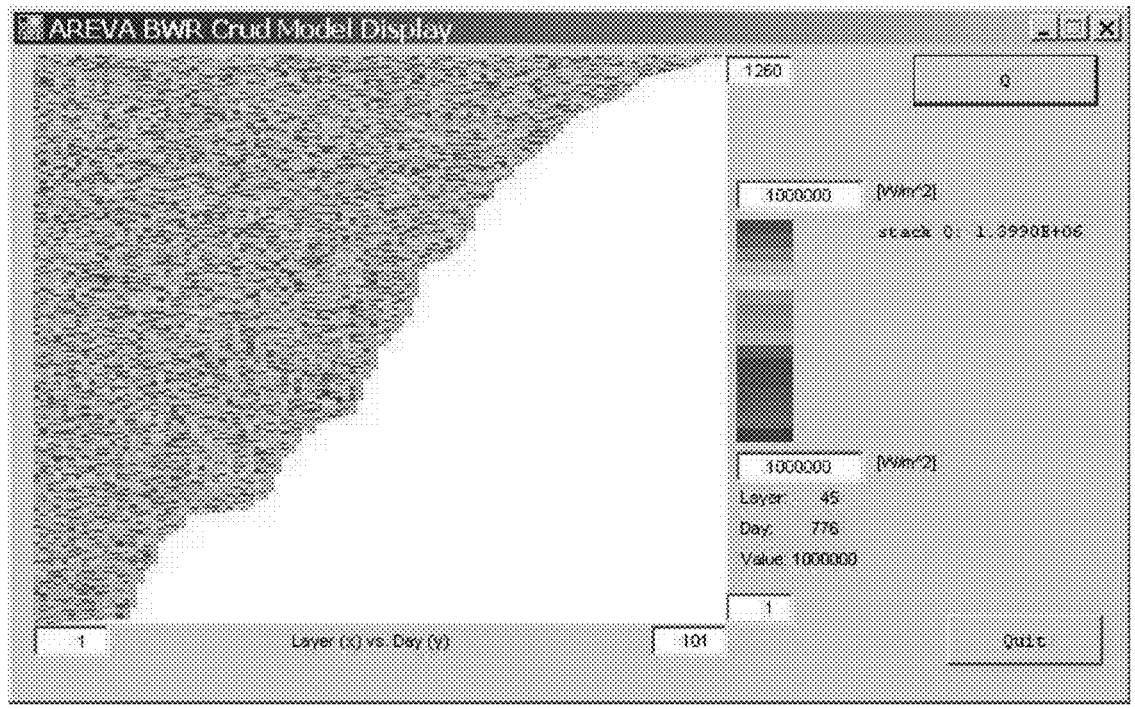
Figure 20:
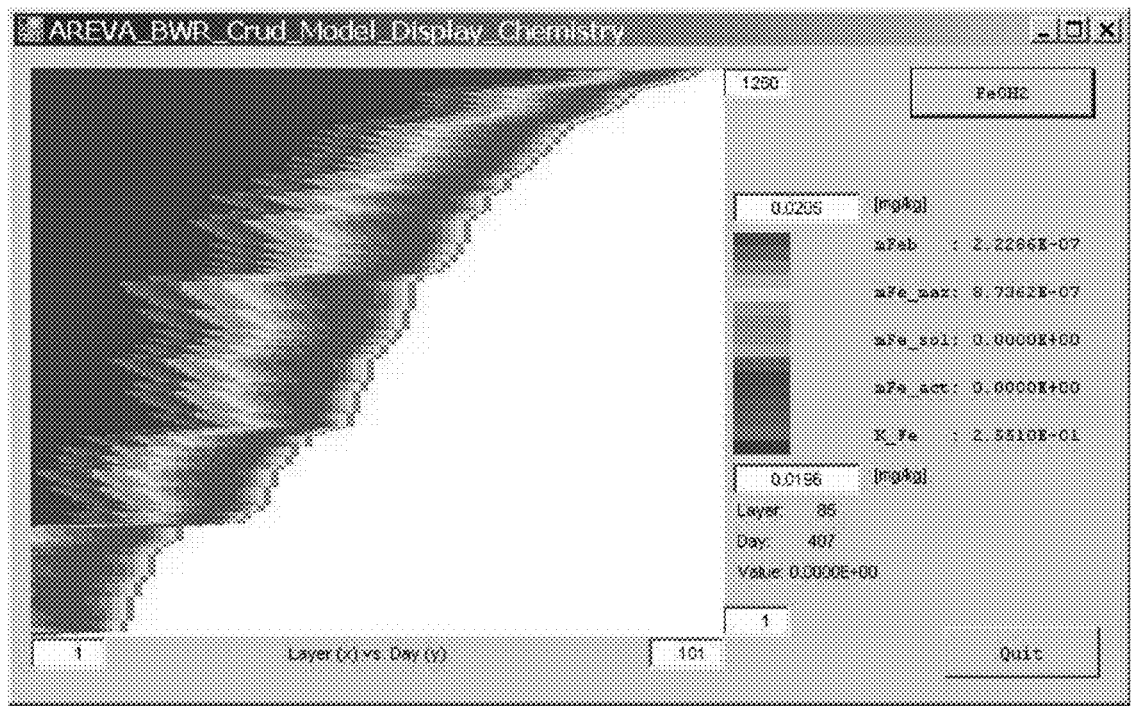
Figure 21:
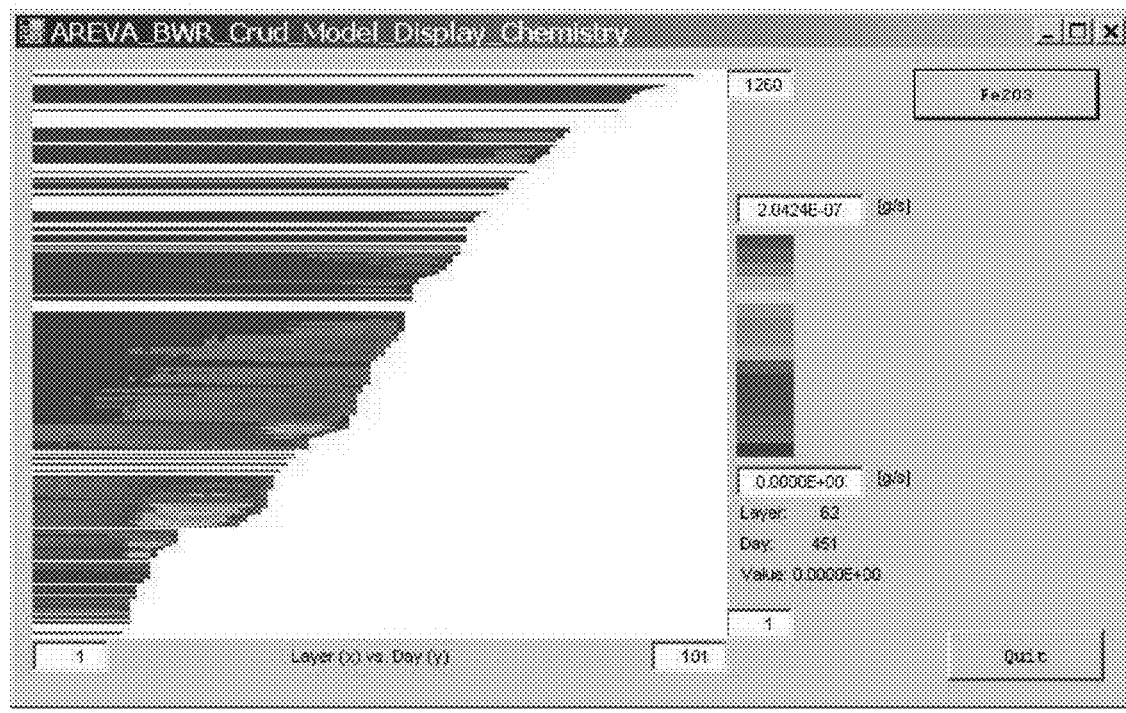
Figure 22:
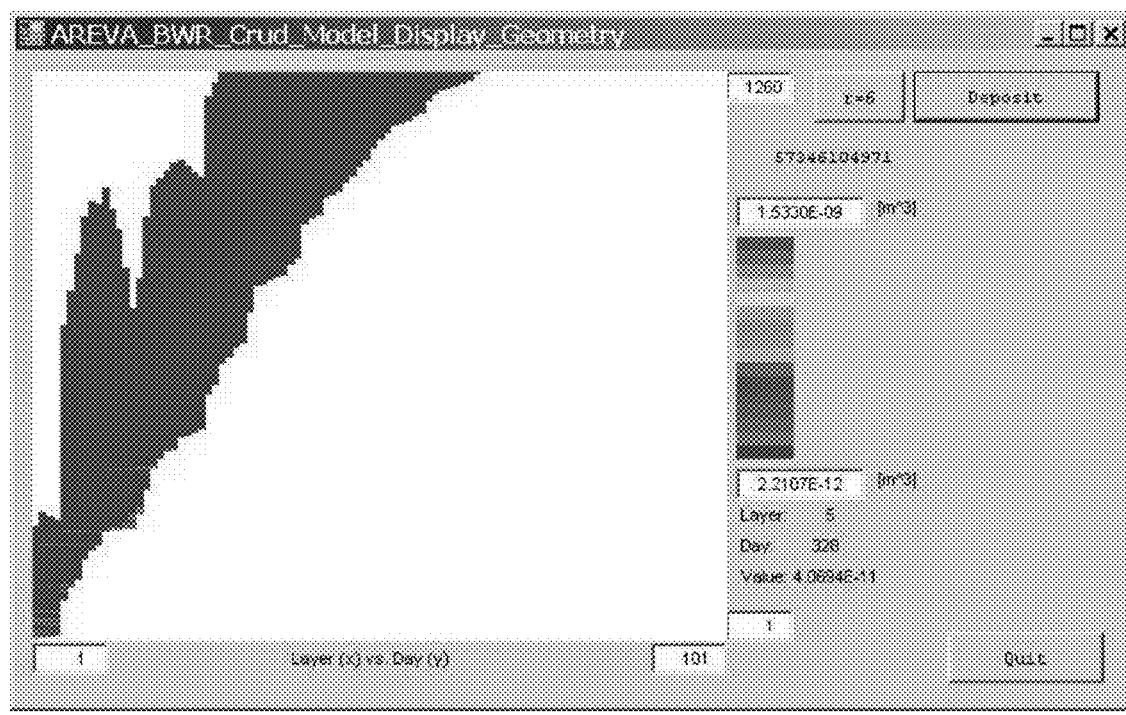
Figure 23:
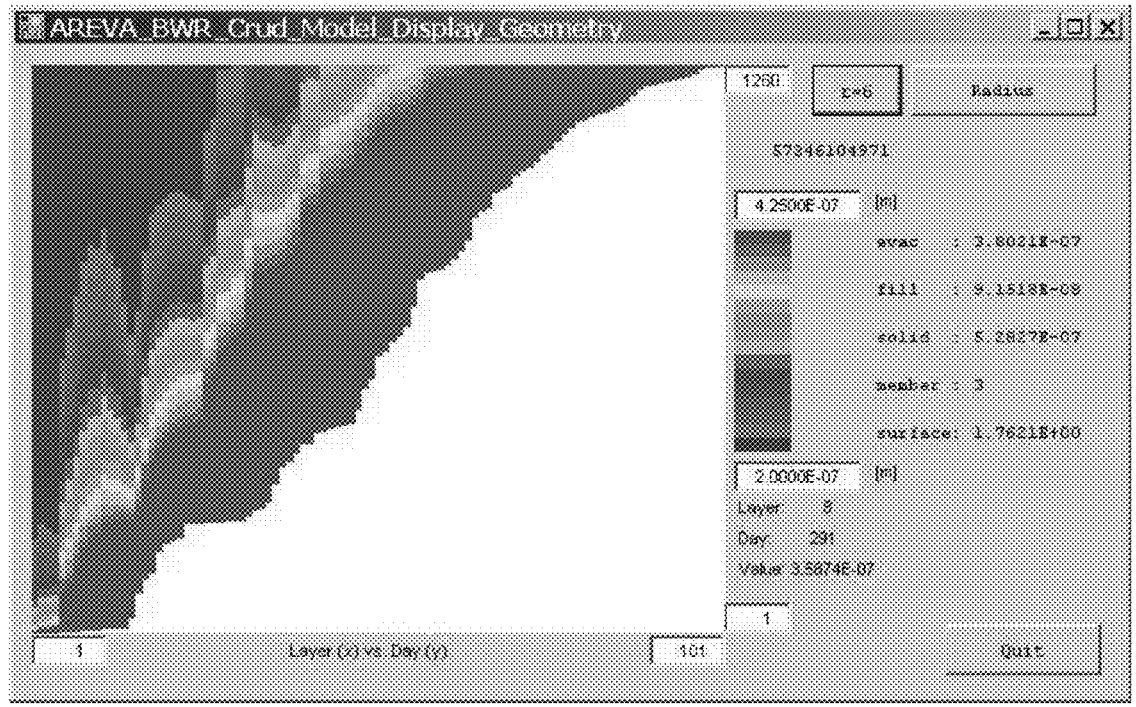
Figure 24:
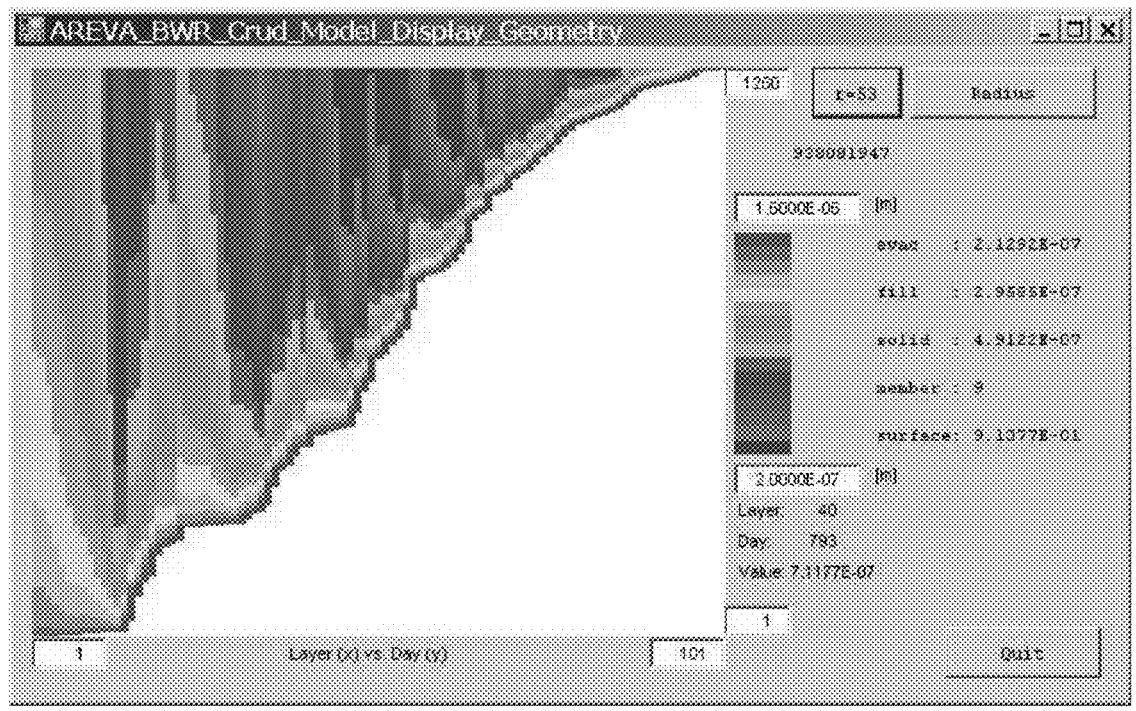

As directed by the computer readable media and/or one of more of the user input devices, display device 206 may display representations of a plurality of real time and past properties of the deposit layer 10, layer increment 24 by layer increment 24. FIGS. 14 to 24 show graphical interfaces that illustrate the evolution of exemplary properties of each layer increment 24 (X-axis) over time (Y-axis). The older layer increments 24 close to the heat transfer surface 12 are shown at the left side of the plots and the newer outer layer increments 24 close to the circulating coolant fluid 14 are shown at the right side of the plots. FIG. 14 shows a plot of the temperature profile of each layer increment 24 over time illustrating that the temperature is higher near the heat transfer surface 12 and increases with time within a layer increment 24; FIG. 15 shows a plot of the conductivity of each layer increment 24 over time, illustrating that because the conductivity is function of a layer increment composition and porosity, the conductivity of the newer (outer) layer increments 24 is lower than that of the older layer increments 24; FIG. 16 shows a plot of the porosity of each layer increment 24 over time, illustrating that the older layer increments 24 are less porous than the newer layer increments 24; FIG. 17 shows a plot of the fractional solid (i.e., the inverse of the porosity) of each layer increment 24 over time; FIG. 18 shows a plot of the evacuated (also called evaporative or convective) heat output of each layer increment 24, which is primarily due to the conversion of water within the larger channels 22 into steam, over time; FIG. 19 shows a plot of the total heat of each layer increment 24 over time (illustrating the quasi static equilibrium condition of the modeled deposit layer 10); FIG. 20 shows a plot of the $FeOH_2$ (soluble iron) concentration of each layer increment 24 over time; FIG. 21 shows a plot of $Fe_2O_3$ (deposited iron oxide) concentration of each layer increment 24 over time; FIG. 22 shows a plot of deposited volume of each layer increment 24 over time; and FIGS. 23 and 24 show plots of channel radii over time, each for one different given family of channels 22. The channels 22 of the family in FIG. 24 each have a radius that is much greater than the channels 22 of the family in FIG. 23. The ability of the user to view these properties of the model analysis allows for both easier model validation and for a more complete understanding of the evolution of the deposit layer 10 and the associated heat transfer performance.

In the preceding specification, the invention has been described with reference to specific exemplary embodiments and examples thereof. It will, however, be evident that various modifications and changes may be made thereto without departing from the broader spirit and scope of invention as set forth in the claims that follow. The specification and drawings are accordingly to be regarded in an illustrative manner rather than a restrictive sense.

What is claimed is:

1. A method of operating a nuclear reactor comprising:
   defining a layer increment of a deposit layer modeling a deposit on a heat transfer surface of the nuclear reactor;
   periodically updating a thickness of the deposit layer by adding the layer increment to the deposit layer;
   recalculating properties of the deposit layer after each layer increment is added to the deposit layer;
   determining a temperature related variable of the heat transfer surface as a function of the recalculated properties of the deposit layer; and
   altering operation of the nuclear reactor when the temperature related variable of the heat transfer surface reaches a predetermined value,
   wherein each of the layer increments includes a same initial predefined geometry including an initial distribution of channels of different sizes, the recalculating properties of the deposit layer after each layer increment is added to the deposit layer including recalculating geometries of each of the channels to vary the channel sizes in each layer increment.

2. The method as recited in claim 1 wherein the altering the operation of the nuclear reactor includes stopping the nuclear reactor or suppressing operation of a region of operating conditions of the nuclear reactor.

3. The method as recited in claim 1 wherein the recalculating properties of the deposit layer after each layer increment is added to the deposit layer includes recalculating geometric properties of each layer increment.

4. The method as recited in claim 3 wherein the geometric properties include channel distributions and channel radiuses.

5. The method as recited in claim 1 wherein the recalculating properties of the deposit layer after each layer increment is added to the deposit layer includes recalculating a chemical equilibrium of the deposit layer.

6. The method as recited in claim 5 wherein the recalculating the chemical equilibrium includes recalculating a deposition of soluble species which are transformed to insoluble species due to local conditions within each layer increment.

7. The method as recited in claim 1 wherein the recalculating properties of the deposit layer after each layer increment is added to the deposit layer includes recalculating a temperature profile of each layer increment.

8. The method as recited in claim 1 further comprising sampling an actual deposit on a heat transfer surface in the nuclear reactor.

9. The method as recited in claim 8 wherein each layer increment of the deposit layer is initially defined based on a porosity of the actual deposit.

10. The method as recited in claim 1 wherein the recalculating properties of the deposit layer after each layer increment is added to the deposit layer comprises the following steps:
    defining a composition of solid species in a newest layer increment added to the deposit layer;
    defining a temperature profile of the deposit layer;
    defining the chemical equilibrium conditions of each of the layer increments of the deposit layer;
    defining a mass balance of solid species in each layer increment of the deposit layer; and
    redefining a geometry of each of the layer increments of the deposit layer as a function of mass balance.

11. The method as recited in claim 1 further comprising displaying at least one of the recalculated properties on a display device.

12. The method as recited in claim 1 wherein the recalculating properties of the deposit layer after each layer increment is added to the deposit layer includes calculating an iterative equilibrium of thermal, hydraulic, chemical and physical deposition conditions over a defined operational period.

13. The method as recited in claim 1 wherein the temperature related variable of the heat transfer surface is the temperature of the heat transfer surface.

14. A system for operating a nuclear reactor, the system comprising a controller programmed to execute the steps of the method as recited in claim 1.

15. A non-transitory computer readable media storing a computer program product, the product including computer executable process steps operable to control a controller to operate a nuclear reactor according to the method as recited in claim 1.

16. The method as recited in claim 1 wherein channels above a predetermined size are defined as being steam chimneys, the recalculating properties of the deposit layer after each layer increment is added to the deposit layer includes redefining at least one of the channels defined as steam chimneys as capillaries if the size of the respective channel falls below the predetermined size.

17. The method as recited in claim 1 wherein for each of the layer increments, a population membership of the channels is constructed using a minimum radius and a radius increment to determine the sizes and quantities of the channels such that the summed total area of the entire channel population does not exceed the defined area of the heat transfer surface times the thickness of the layer increment.

18. A method of operating a nuclear reactor comprising:
    defining a layer increment of a deposit layer modeling a deposit on a heat transfer surface of the nuclear reactor;
    periodically updating a thickness of the deposit layer by adding the layer increment to the deposit layer;
    recalculating properties of the deposit layer after each layer increment is added to the deposit layer;
    determining a temperature related variable of the heat transfer surface as a function of the recalculated properties of the deposit layer; and
    altering operation of the nuclear reactor when the temperature related variable of the heat transfer surface reaches a predetermined value,
    wherein the periodically updating a thickness of the deposit layer by adding the layer increment to the deposit layer includes iteratively estimating that a sufficient amount of time for a deposit thickness equal to the layer increment thickness to be added to the heat transfer surface has elapsed before adding the layer increment.

19. A method of operating a nuclear reactor comprising:
    defining a layer increment of a deposit layer modeling a deposit on a heat transfer surface of the nuclear reactor;
    periodically updating a thickness of the deposit layer by adding the layer increment to the deposit layer;
    recalculating properties of the deposit layer after each layer increment is added to the deposit layer;
    determining a temperature related variable of the heat transfer surface as a function of the recalculated properties of the deposit layer; and
    altering operation of the nuclear reactor when the temperature related variable of the heat transfer surface reaches a predetermined value,
    wherein the recalculating properties of the deposit layer after each layer increment is added to the deposit layer includes calculating a temperature profile inside each layer increment using a distribution of channels acting as steam chimneys that evacuate heat out of the deposit layer to coolant fluid, the distribution of channels changing layer increment by layer increment.

* * * * *